United States Patent [19]

Todokoro et al.

[11] Patent Number: 5,276,325
[45] Date of Patent: Jan. 4, 1994

[54] SCANNING MICROSCOPE AND A METHOD OF OPERATING SUCH A SCANNING MICROSCOPE

[75] Inventors: Hideo Todokoro, Tokyo; Tadashi Otaka; Osamu Yamada, both of Katsuta, all of Japan

[73] Assignee: Hitachi, Ltd., Tokyo, Japan

[21] Appl. No.: 945,926

[22] Filed: Sep. 17, 1992

[30] Foreign Application Priority Data

Sep. 17, 1991 [JP] Japan ............................. 2-262528

[51] Int. Cl.$^5$ ...................... H01J 37/28; G02B 21/00
[52] U.S. Cl. ...................................... 250/310; 250/311; 250/306; 250/307
[58] Field of Search ................ 250/310, 306, 307, 311

[56] References Cited

U.S. PATENT DOCUMENTS

| | | | |
|---|---|---|---|
| 4,031,390 | 6/1977 | Muller et al. | 250/307 |
| 4,091,374 | 5/1978 | Muller et al. | 250/311 |
| 4,189,641 | 2/1980 | Katagiri et al. | 250/311 |
| 4,604,523 | 8/1986 | Knowles et al. | 250/310 |

FOREIGN PATENT DOCUMENTS

| | | | |
|---|---|---|---|
| 61-66352 | 4/1986 | Japan | 250/311 |
| 533670 | 1/1983 | U.S.S.R. | |
| 2123249 | 1/1984 | United Kingdom | 250/311 |

Primary Examiner—Jack I. Berman
Attorney, Agent, or Firm—Antonelli, Terry, Stout & Kraus

[57] ABSTRACT

A scanning microscope, such as a scanning electron microscope, has an energy beam which is caused to scan on a sample. A detector detects the interaction of the beam with the sample and generates sample image signals which are used to generate a display image of the scanned part of the sample. The sample image signals may be stored in an image memory, and a part of those sample image signals are read to generate the display image. This permits an effective magnification to be achieved without scanning the sample with scanning lines which are too close. Alternatively, or in addition, the beam may be cut intermittently during the scanning, at least for magnification above a predetermined limit. Where scanning is in a series of frames, each formed of a series of scanning lines, such cutting may change the interval between frames, the interval between lines, or may cause intermittent cutting within a line. All these changes reduce the duration of the beam on the sample, thereby reducing the risk of excessive charge build-up.

28 Claims, 9 Drawing Sheets

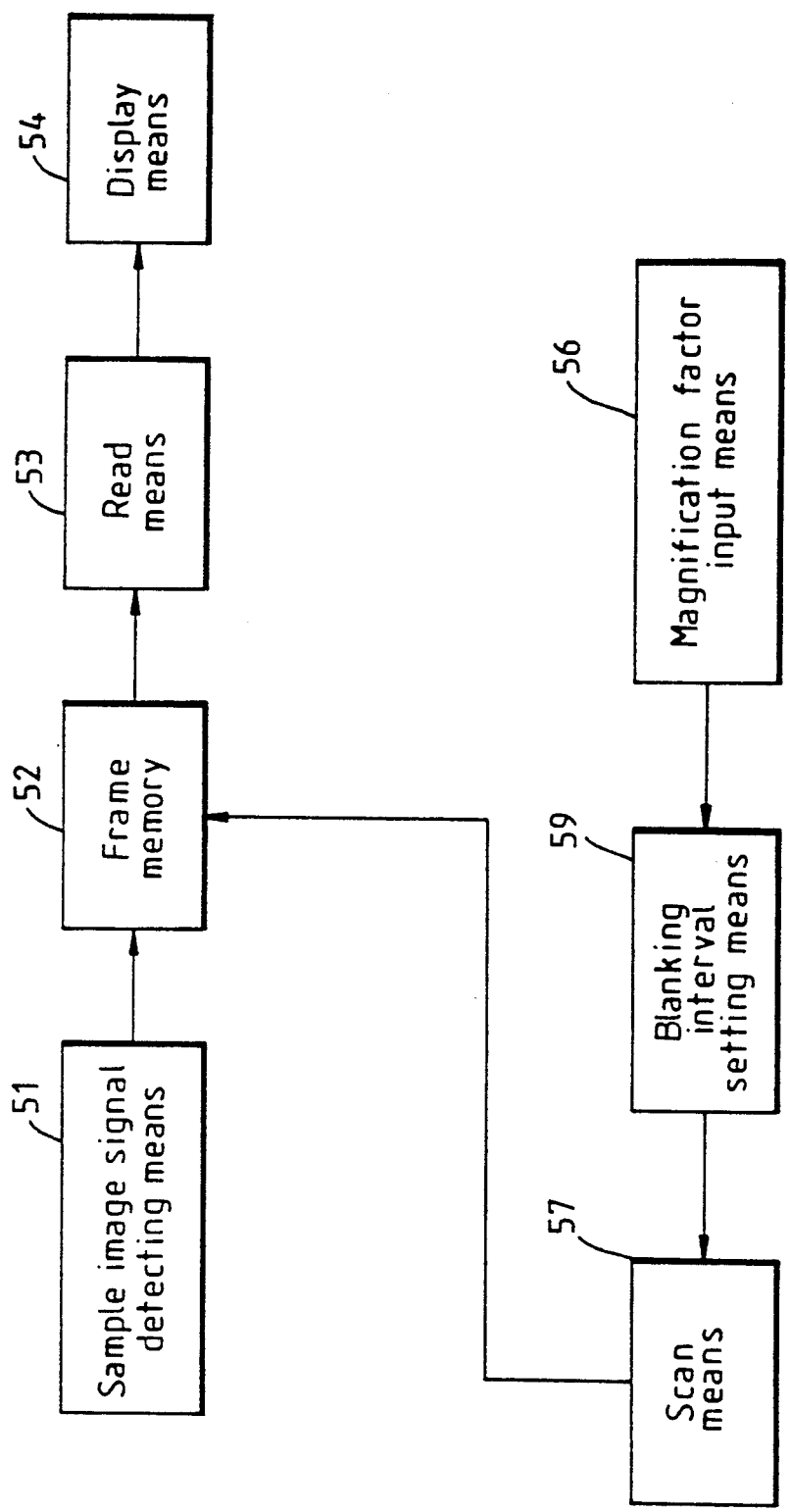

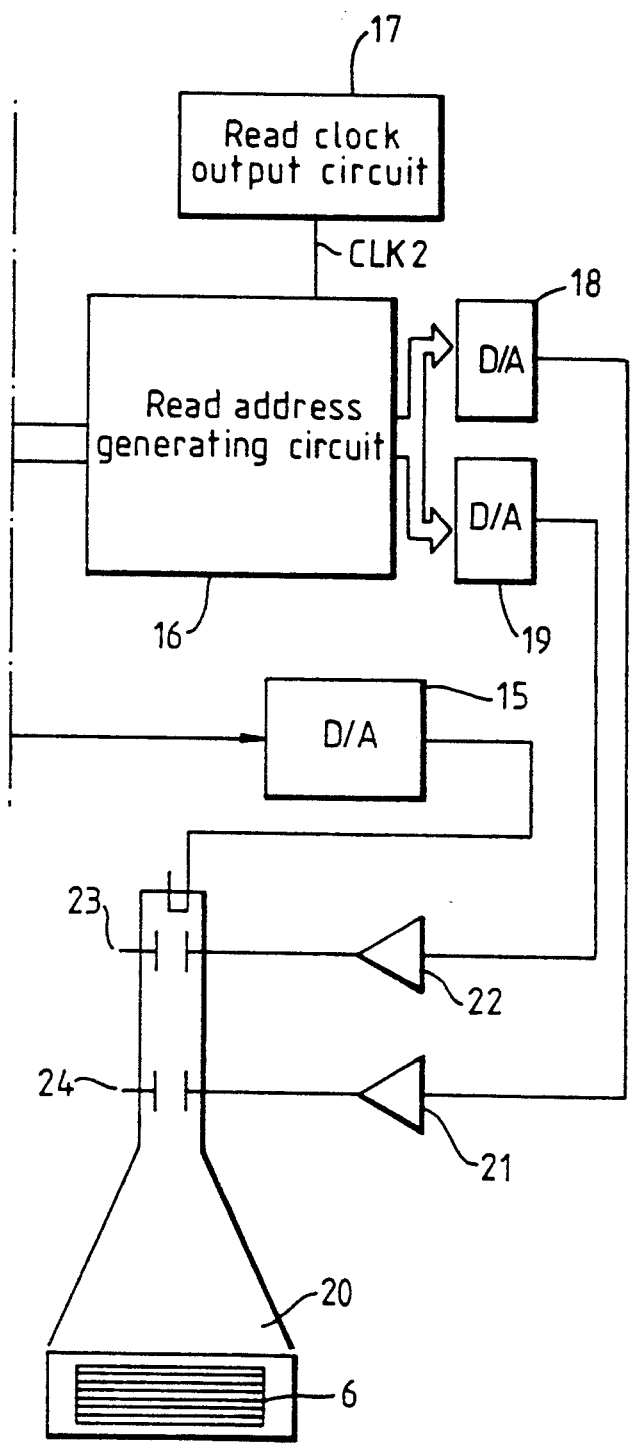
FIG. 7 contd.

SCANNING MICROSCOPE AND A METHOD OF OPERATING SUCH A SCANNING MICROSCOPE

BACKGROUND OF THE INVENTION

The present invention relates to a scanning microscope in which an energy beam scans a sample. It is applicable, for example, to a scanning electron microscope, in which the energy beam is made up of electrons, but is also applicable to a scanning microscope using other charged particles, such as ions, and also to a scanning microscope using a laser beam.

In a scanning electron microscope, a sample is scanned by an electron beam and this generates a secondary signal from the sample which is detected and converted to sample image signals. The sample image signals are processed to modulate the luminance of a display image. The display image may be produced, for example, on a cathode ray tube. Scanning occurs by causing the beam to sweep along a series of parallel lines (scanning lines) which define an area on the sample, that area being known as a scanning frame. The distance between the scanning lines is known as the scan interval.

It is usual for the size of the display image to be fixed. Therefore, if the dimensions of the scanning frame of the energy beam on the sample are reduced, the effective magnification of the display image will be increased. Normally, the number of scanning lines in a scanning frame is determined such that the scanning lines of the display are not noticeable when viewed directly by an observer. Thus, they depend on the resolution of the cathode ray tube. Generally, 500–1000 scanning lines are used.

In such an arrangement, the number of scanning lines of the energy beam on the sample within a scanning frame is constant. Therefore, in order to increase the effective magnification, the length of the scanning lines is reduced and the scan interval between the scanning lines is varied.

It is possible to generate a display image directly from the sample image signals. However, it is known to convert the sample image signals into digital signals, and store those digital signals in an image memory. Then, by reading out the content of the image memory, a display image may be generated. With such a technique, it is usual for the image memory to store the sample image signals of only one frame, at any time, and therefore the image memory may also be referred to as a frame memory.

Although it is normal for the energy beam to be focused into a fine spot, in a scanning microscope, the scanning operation described above, in which scanning occurs in a series of parallel scanning lines defining a scanning frame, causes the spot to sweep out a series of areas corresponding to the scanning lines. As the desired magnification is increased, and the scan interval is decreased, the areas swept out for each scanning line approach each other. At a predetermined magnification, the area swept out by the spot along one scanning line will adjoin the area swept out by the spot for the immediately adjacent scanning line. For smaller scan intervals, the areas will overlap. When such overlapping occurs, no further increase in the resolution of the scanned image is possible.

When such overlap occurs, in e.g. an electron microscope, the current density on the specimen may become excessively high. This may cause heating of the specimen and, if the sample is or contains insulating material, may cause accumulation of charged particles on the sample. Furthermore, the build-up of charged particles may affect the sample itself, causing contamination. This problem is particularly acute in the investigation of semiconductor elements using electron microscopes, since charge build-up occurs on insulating layers (such as photoresist), and such charge build-up may affect the properties of the semiconductor element itself. Indeed, such problems may arise even at magnifications below that which corresponds to overlapping of the areas swept out by the spot of the energy beam for adjacent scanning lines.

It may further be noted that problems due to increased current density occur not only during observation of a sample, but also during focusing or astigmatic compensation. Focusing can be achieved with high precision if high magnifications are used. Therefore, even if the sample is to be observed only at relatively low magnifications, focusing may make use of high magnifications, involving magnification of part of the sample. Since the scan interval is thus reduced for the automatic focusing step, the current density will be high for the part of the specimen scanned during the focusing operation. This may damage the specimen or contaminate it. Similar considerations apply to astigmatism correction.

SUMMARY OF THE PRESENT INVENTION

As has previously been described, it is known to store the sample image signals from the sample in an image memory. In conventional systems, the area (in memory space) which is read out from the image memory is fixed and corresponds to the whole of one frame. However, it has been realized that the reading of a part of the content of the image memory, corresponding to a part of the scanning frame, and displaying a display image of that part can result in an effective increase in magnification.

Therefore, a first aspect of the present invention proposes that the proportion of the image memory which is read is determined in dependence on the desired magnification. As the magnification is varied, so the proportion of the image memory changes.

It is possible to apply this technique for all magnifications. However, it is particularly useful for magnifications above that which causes overlapping of the area swept out by the energy beam for adjacent scanning lines. Below that magnification, it may be possible to achieve a suitable magnification, without excessive current density on the sample, by varying the scan interval. However, such variation of the scan interval can be halted when the areas swept out by the spot of the energy beam for adjacent scanning lines are adjoining, and the technique of the first aspect of the present invention applied above that magnification. For lower magnifications, the proportion of the image memory which is read out may be fixed, e.g. corresponding to one scanning frame.

Since the scanning image signals are stored in the image memory, it is possible to generate a further display image using a second group of signals from the image memory. The two displays may then be generated simultaneously. Although this may be applied for variations in magnification, in accordance with the first aspect of the present invention, the generation of two display images from a common frame memory is a second, independent, aspect of the present invention.

The two displays may relate to different or overlapping groups of scanning image signals from the image memory. Indeed, it is possible to read out simultaneously the scanning image signals corresponding to a whole frame, and the scanning image signals of part of that frame, so that two displays can be generated corresponding to different magnifications.

In either of the two aspects of the present invention discussed above, a problem may arise when the selected part of the frame memory, from which sample image signals are read, is small. There are then only a few signals from which the display image is to be generated and this can cause degradation of the display image. Therefore, it is possible to generate interpolation signals which are added to the sample image signals read from the frame memory, before the display image is generated. Such interpolation signals are derived from the sample image signals which are read from the frame memory using a suitable interpolation process, such as signal duplication, or signal averaging.

The two aspects of the present invention discussed above relate to the processing of signals from the image memory. However, it is also possible to address the problem of excessive current density on the sample by considering the scanning of the beam. The subsequent aspects of the present invention relate to this approach.

According to a third aspect of the present invention, it is proposed that the beam be intermittently and repeatedly cut off from the sample at a cutting interval or cutting duration, which interval or duration is varied in dependence on the magnification. At high magnifications, the cutting interval (the period between one cutting operation and the next) may be reduced, or the cutting duration (the time of cut-off) may be increased. In this way, the time for which the beam is incident on the sample is reduced, thereby reducing or preventing excessive current densities.

This aspect of the present invention may also be considered as creating a blanking ratio between the durations of the on and off states of the beam on the sample, with that blanking ratio being varied in dependence on the magnification. It should be noted that it is possible wholly to cut-off the beam, at the source thereof, but it is normally easier to deflect the beam and use a blanking aperture or other obstruction to cut off the beam.

Within this third aspect of the present invention, various cutting techniques may be used. For example, the beam may be cut off from the sample for some of the scanning lines of a scanning frame. This technique is particularly useful at magnifications corresponding to those which cause overlapping of the area swept out by the spot of the beam for adjacent scanning lines. Then, by cutting out alternate scanning lines, overlapping of the beam is prevented. It should be noted that this is not the same as varying the scan interval (i.e. the distance between the lines) since the duration of incidence of the beam on the sample is then unchanged, and therefore there is a risk of charge density build-up. If some of the scanning lines are cut off in this way, the time for which the beam is incident on the sample is reduced. An alternative technique is to vary the interval between the scanning frames, e.g. wholly to cut-out one or more scanning frames, or to cut the beam intermittently within some or all of the scanning lines. Each of these techniques reduces the time for which the beam is incident on the sample.

These techniques are particularly useful when applied above a predetermined magnification. Indeed, the variation of the duration between scanning lines, the variation of the interval between the scanning frames, or the use of discontinuous scanning lines, above a predetermined magnification, represents another aspect of the present invention. These techniques may be applied at magnifications below those which correspond to overlapping areas being swept out by the spot of the beam for adjacent scanning lines. It may be necessary to make use of this aspect of the present invention below such a magnification, in order to minimize the period of incidence of the beam on the sample, to prevent charge build-up. This is, for example, particularly important for investigation of a semiconductor element by a scanning electron microscope.

In this way, accumulation of a charge on the insulating materials of the sample may be minimized, preventing contamination of the sample, or otherwise affecting the behavior of semiconductor devices of the sample.

It should be noted that the present invention relates to both a scanning microscope and a method of operating a scanning microscope incorporating any or all of the aspects of the present invention discussed above.

BRIEF DESCRIPTION OF THE DRAWINGS

Embodiments of the present invention will now be described in detail, by way of example, with reference to the accompanying drawings, in which:

FIG. 6 is a block diagram illustrating functional operations of a third embodiment of the present invention.

DETAILED DESCRIPTION

Figure 1:
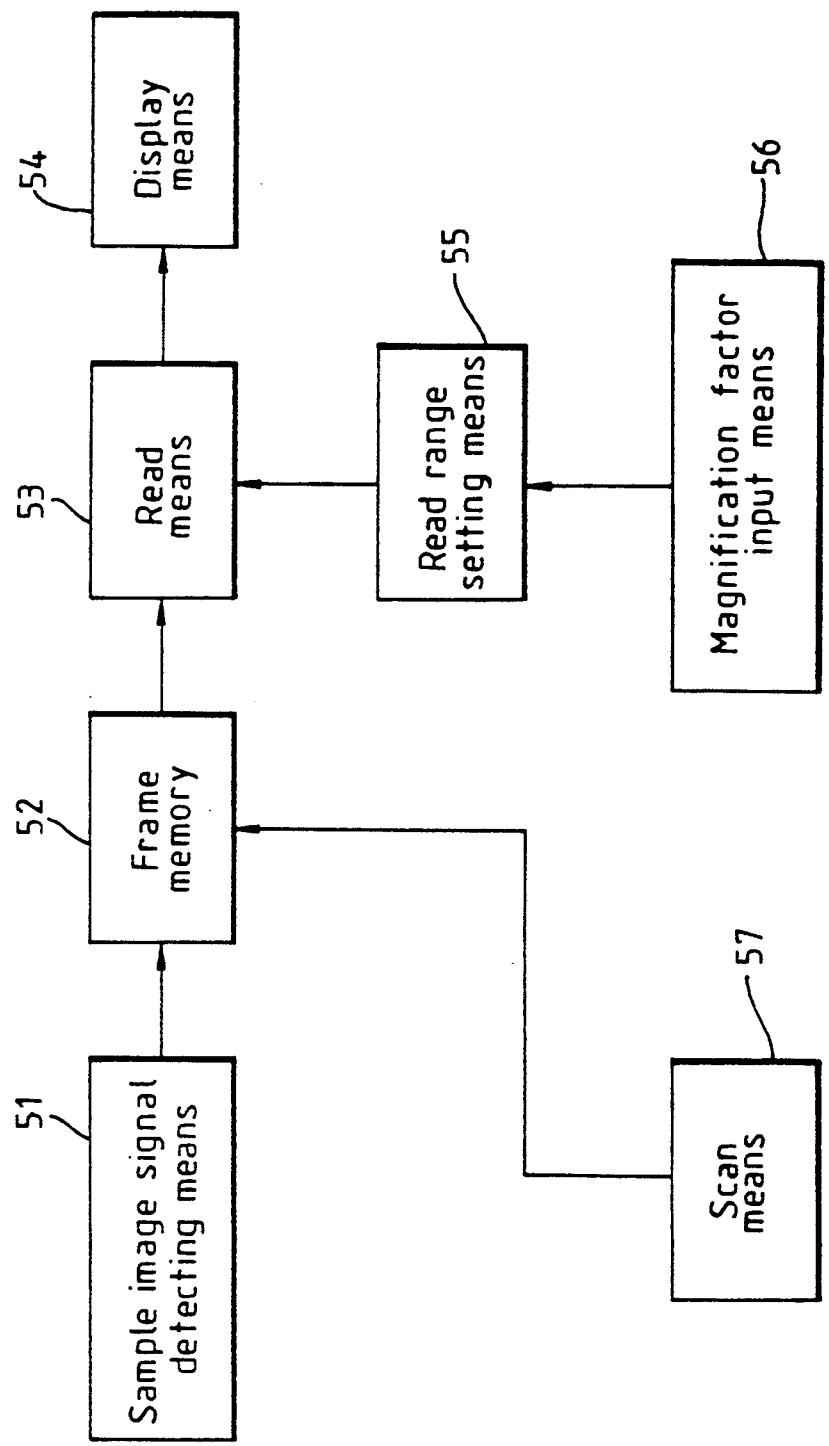
FIG. 1 is a block diagram illustrating functional operations of a first embodiment of the present invention.

FIG. 1 shows a functional block diagram of a first embodiment of the present invention.

In FIG. 1 a scan means 57 scans a sample with an energy beam in such a way as to avoid overlapped scanning. A sample image signal detecting means 51 detects a secondary sample image signal emitted from the sample, which is scanned by the energy beam. A frame memory 52 stores the detected sample image signals with the scan positions of the beam swept by the scan means 57 as address information.

As previously mentioned, the scanning operation causes a spot formed by the beam to move in a series of lines (scanning lines) and for successive scanning lines to be adjacent so as to define the scanning area, which is known as a frame. The scanning operation for a frame is repeated by the scanning returning to the first scanning line of the frame. Conventionally, the content of the frame memory 52 corresponds to the secondary sample image signals of one frame. However, the present invention is not limited to this and the frame memory 52 may contain signals derived from more than one scanning frame.

The length of each scanning line, and the distance between one scanning line and the next (which distance is referred to as the scan interval) is varied in dependence on the desired magnification. The larger the frame area, the smaller the magnification. It can readily be seen that, since the beam forms a spot on the sample, each scanning line defines an area which is swept out by the spot as it moves along the scanning line and, as previously mentioned, it is not desirable for there to be an overlap of the areas swept by the spot for adjacent scanning lines.

A magnification factor input means 56 permits the input of a desired magnification factor. A read range setting means 55 sets the read range in the image (frame) memory 52 according to the magnification factor. The read means 53 reads the appropriate sample image signals from the specified range of the frame memory 52 and transfers it to a display means 54. The display means 54 displays a scanned image corresponding to the sample image signals onto a specified constant area on the screen irrespective of the size of the read range.

With this arrangement, the sample image signals read from the read range of the frame memory are displayed within a certain constant area on the display means 54 regardless of the size of the read range set by the read range setting means 55. Thus, reducing the read range gives an effect corresponding to an increase in the magnification factor without reducing the scan interval (i.e. the distance between one line of scanning and the next).

Therefore, it is possible to produce a scanned image with a desired magnification without having to reduce the scan interval to such a degree that the area scanned by the beam for one line of scanning overlaps with the area scanned by the beam for an adjacent line of scanning. This prevents or reduces temperature rise in the sample, accumulation of charges on any insulating material of the sample, and contamination of the sample.

Figure 2:
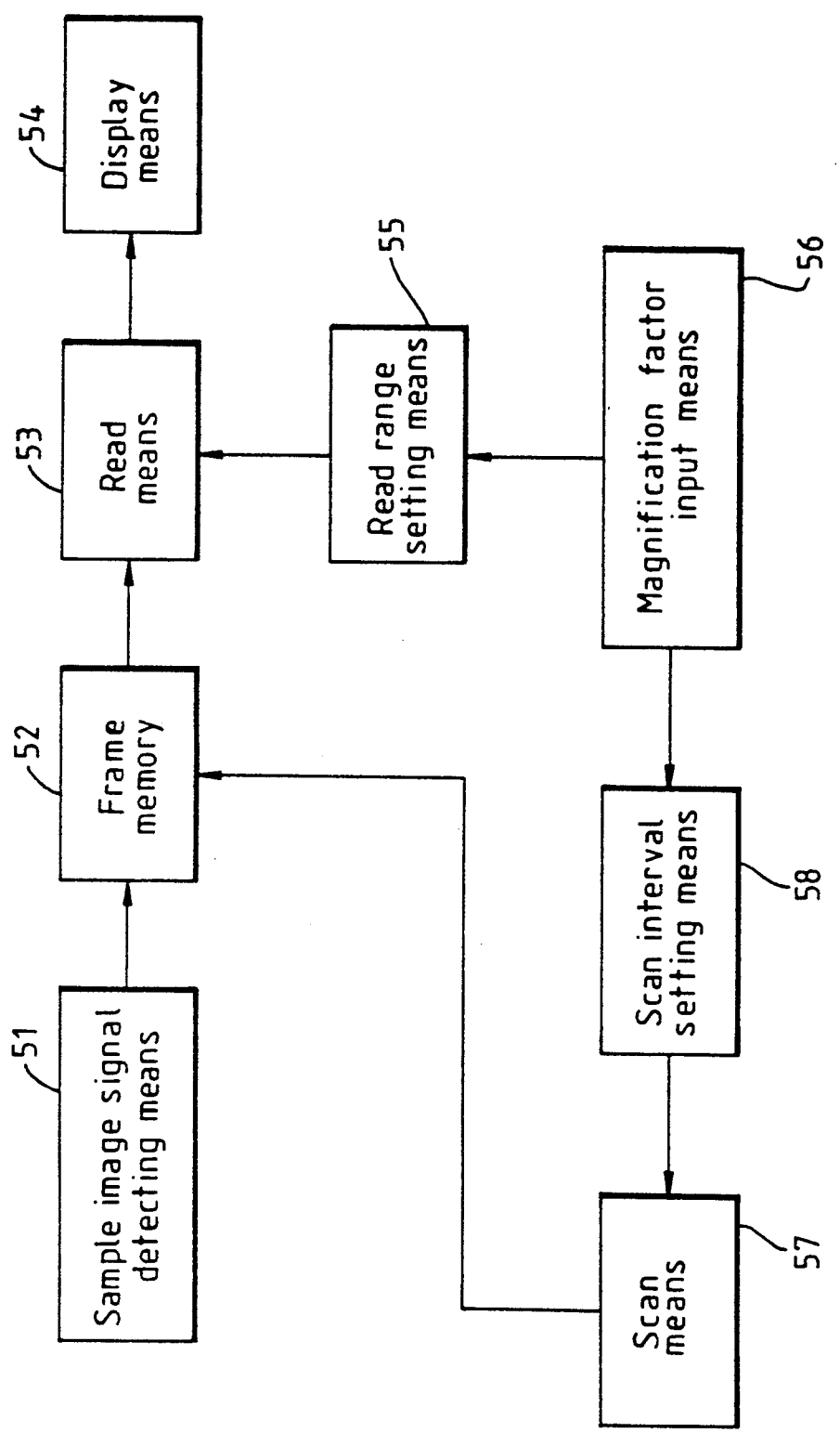
FIG. 2 is a block diagram showing functional operations of a second embodiment of the present invention.

FIG. 2 shows a fundamental block diagram of a second embodiment of the present invention. The arrangement of this embodiment is similar to that of the embodiment of FIG. 1, and blocks having the same or similar function as blocks of FIG. 1 are indicated by the same reference numerals.

In the embodiment of FIG. 2, an interval setting means 58 sets the main intervals between scanning frames (the frame interval) of the energy beam, or the intervals between individual scanning lines (the scan interval), according to the magnification factor. The scan means 57 causes the energy beam to sweep on the sample at the set interval.

Figure 3:
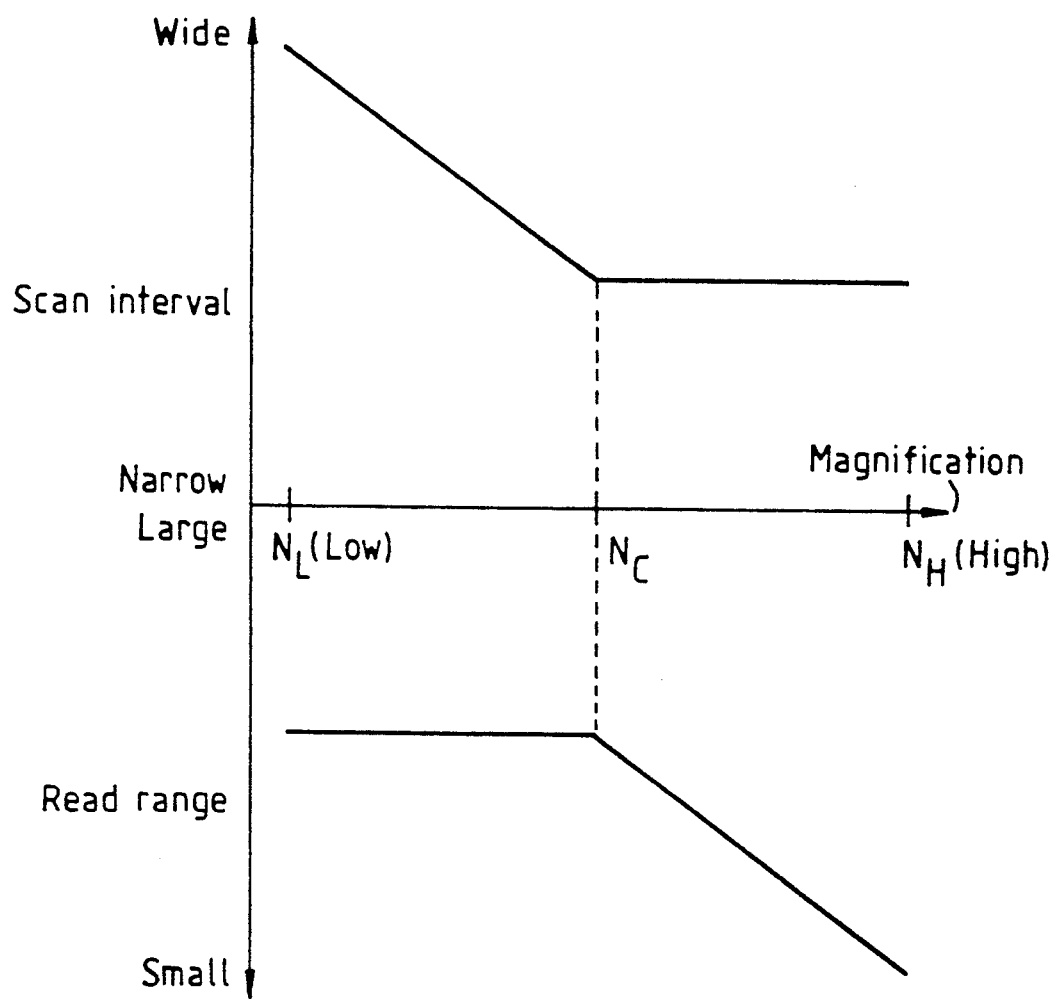
FIG. 3 is a graph showing the relationships between magnification and scan interval/read range.

FIG. 3 shows the relationship between the magnification factor, the scan interval set by the interval setting means 58, and the read range. At a low magnification factor range ($N_L - N_C$), the scan interval decreases with an increasing magnification factor. After the magnification factor exceeds a predetermined value $N_C$, the scan interval remains constant.

The read range is constant for the low-magnification range. At a high-magnification range ($N_C - N_H$) higher than the predetermined value $N_C$, the read range decreases with an increasing magnification factor. The predetermined magnification factor $N_C$ is set to correspond to the maximum magnification factor for which the areas swept by the beam for adjacent scanning lines do not overlap or to the minimum magnification factor for which the areas overlap.

With this configuration, in the range from the low-magnification factor $N_L$ to the predetermined factor $N_C$, the scan means 57 changes the scan interval to obtain the desired magnification for observation. In the range higher than the predetermined magnification factor $N_C$, the read means 53 changes the read range in the frame memory to obtain a desired magnification.

Since the areas swept by the energy beam for adjacent scan lines do not overlap during high-magnification observation, temperature increase of the sample, accumulation of charges on any insulating material of the sample and contamination can be reduced or eliminated.

The current density on the sample depends also on the beam current of the energy beam, so that the predetermined magnification factor NC is preferably made to decrease with an increasing beam current.

Figure 4A:
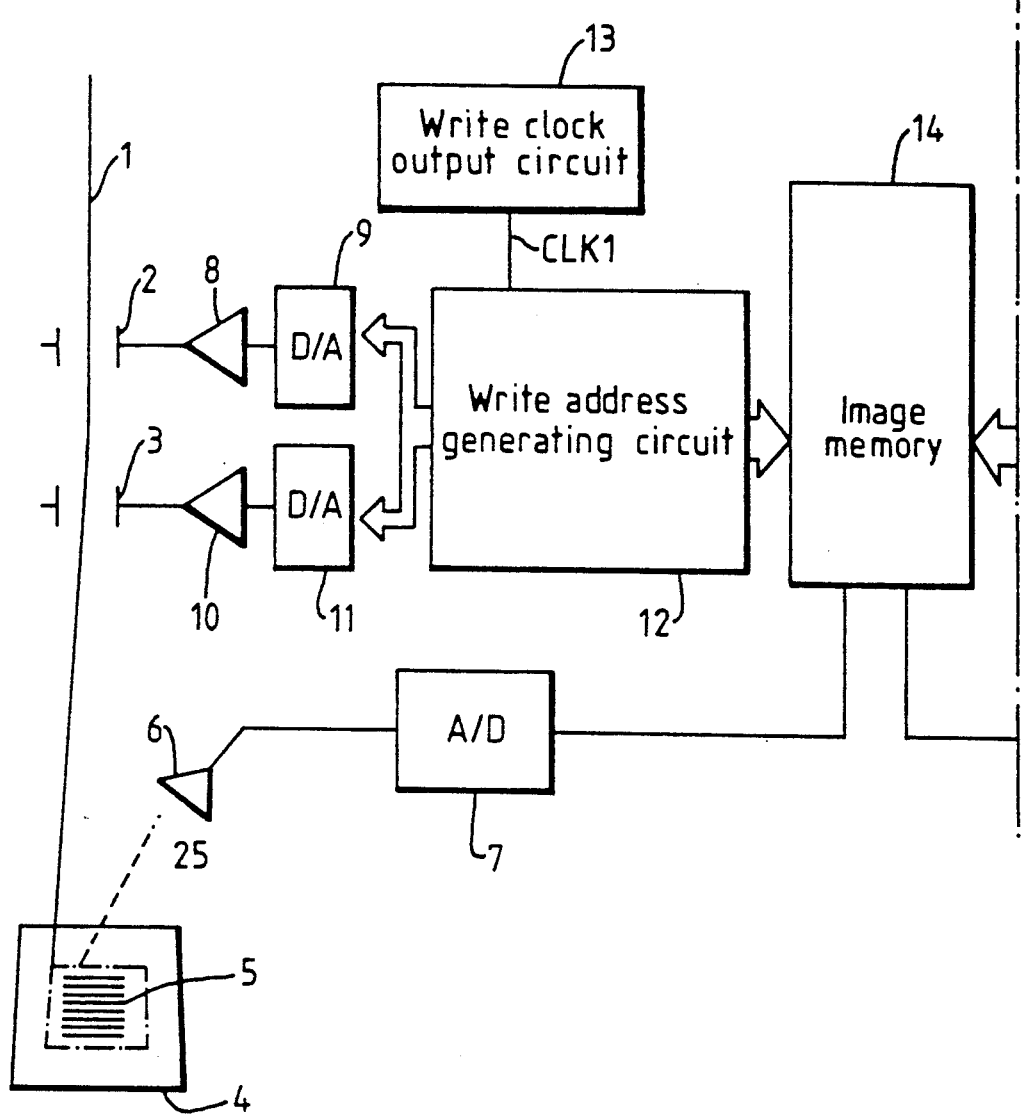
FIGS. 4(a) and 4(b), when combined, form a schematic diagram of a scanning electron microscope incorporating the first or second embodiments of the present invention.
Figure 4B:
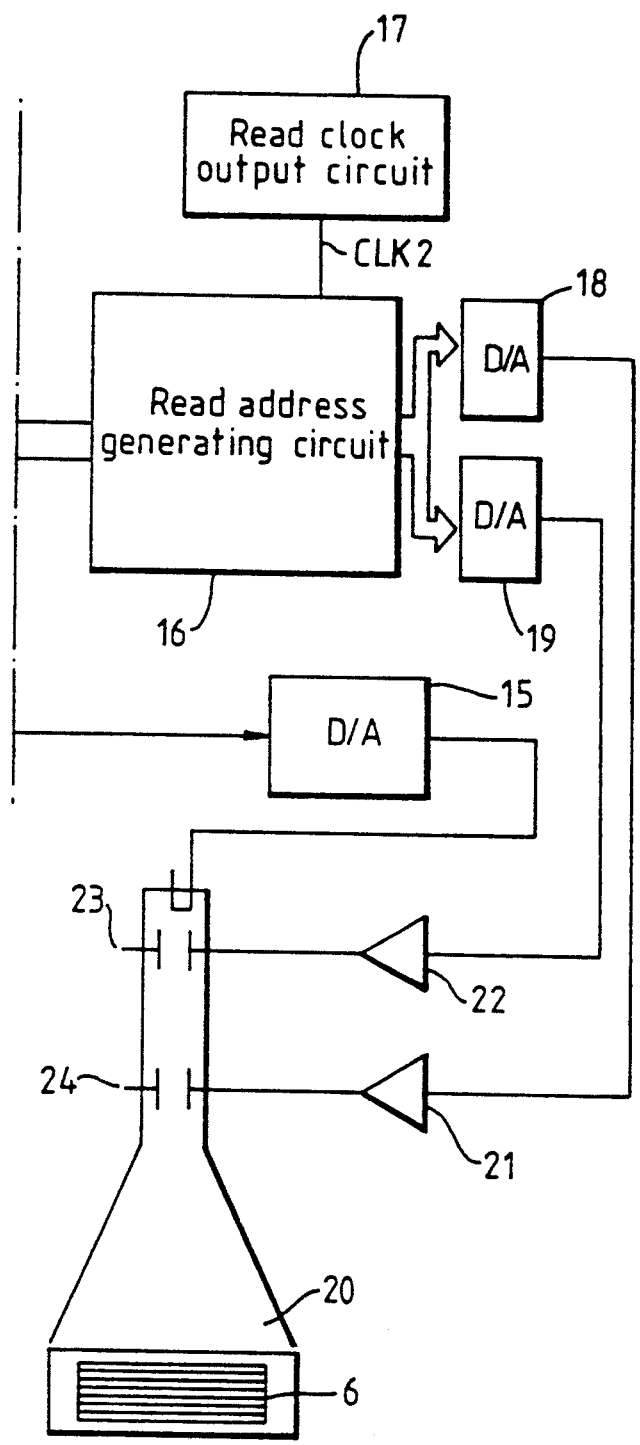

FIG. 4(a) and 4(b), when combined, form a block diagram illustrating in more detail the configuration of a scanning electron microscope of the first or second embodiment of this invention.

In the figure, an image memory 14 consists, for example, of 2048 by 2048 pixels and has a capacity that allows 256 tones of depth gradation. A write address generating circuit 12 generates a write address by using a clock signal CLK, as a synchronization signal. The clock signal $CLK_1$ is output from a write clock output circuit 13, and the write address generating circuit 12 outputs the write address to the image memory 14 and D/A convertors 9, 11.

When, for example, the period of the clock signal $CLK_1$ is 238 ns, the TV scanning forms one frame of scan image every one thirtieth of a second. The period of the clock signal can be determined arbitrarily and it is possible for the scanning to be slow taking as much as 10 seconds per one frame of the image, for example.

The X-scan D/A convertor 9 receives a digital signal, which is repeatedly changing between value 0 and 2047, converts it into an analog signal of saw-tooth waveform, and outputs the analog signal. The Y-scan D/A convertor 11 receives a digital signal, which is repeatedly changing between value 0 and 2047 and which is incremented by one when the output of the X-scan D/A convertor 9 has completed the cycle from 0 to 2047. The D/A convertor 11 converts the digital signal into an analog signal of saw-tooth waveform before outputting it.

The saw-tooth analog signals output from the D/A convertors 9, 11 are amplified by an X-scan amplifier 8 and a Y-scan amplifier 10 and fed to an X-scan deflecting plate 2 and a Y-scan deflecting plate 3. By changing the amplification of the X-scan amplifier 8 and the Y-scan amplifier 10, the area (frame) scanned by the electron beam 1 on the sample 4 can be changed as desired.

A read address generating circuit 16 uses a clock signal $CLK_2$ from a read clock output circuit 17 as a synchronization signal in generating the read address which corresponds to the magnification factor. The generated read address is fed to the image memory 14 and D/A convertors 18, 19.

The signals output from the D/A convertors 18, 19 are amplified by an X-scan amplifier 21 and a Y-scan amplifier 22 to predetermined voltage levels. The converted voltages are supplied to an X-deflection plate 23 and a Y-deflection plate 24 of the display formed by the cathode ray tube 20 to raster-scan the electron beam on the display.

The image information read from the image memory 14 in response to the read address is converted by a D/A converters 15 into an analog signal (voltage), which modulates the luminance of the cathode ray tube 20.

In such a configuration, the electron beam 1 is finely focused by a focusing system (not shown) and is deflected by the X-scan deflecting plate 2 and the Y-scan deflecting plate 3 to sweep across the sample 4 in a raster scanning mode.

Secondary electrons 25 emitted by the sample 4 (although reflection electrons are also emitted, only secondary electrons will be referred to in the following explanation) are captured by a secondary electron detector 6, whose detection signal is converted by an A/D convertor 7 into digital data and stored in the image memory 14. Since the addresses of the image memory 14 can have a one-to-one correspondence with the scan positions of the electron beam 1, image information corresponding to the scan region 5 on the sample 4 is stored in the image memory 14.

When a magnified image is to be displayed on the cathode ray tube 20, the read address generating circuit 16 generates a read address corresponding to the magnification factor.

Figure 5A:
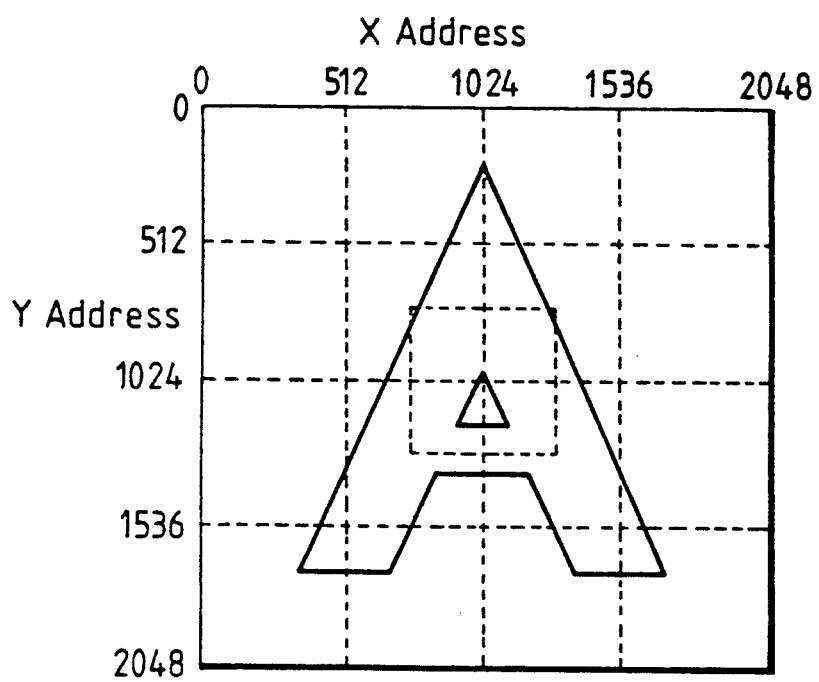
FIGS. 5(a) and 5(b) show magnification of an image according to the first or second embodiment of the present invention.
Figure 5B:
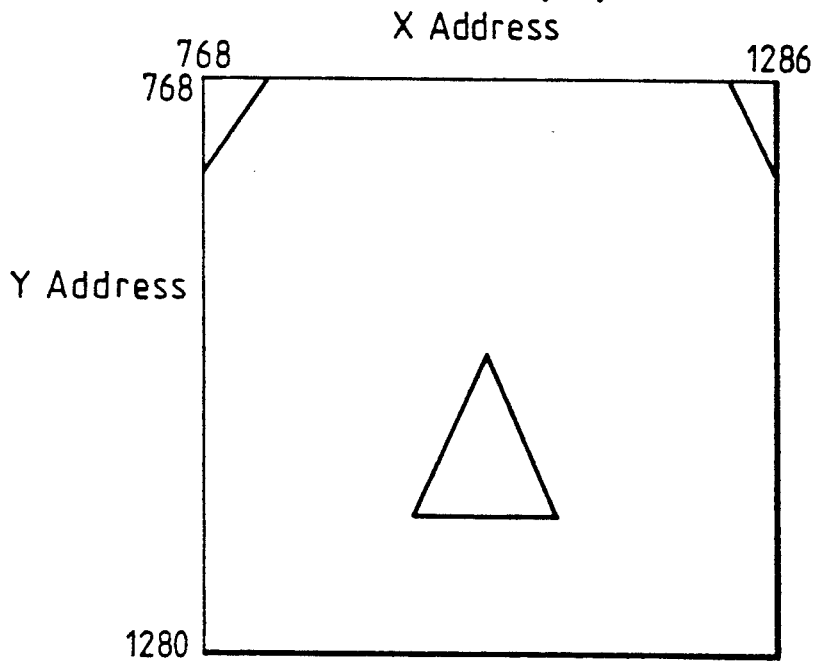

When, for example, a part of the image information "A" stored in the 2048×2048 memory area as shown in FIG. 5(a) is to be magnified four times and displayed, the read address generating circuit 16 outputs to the X-scan D/A convertor 18 a digital signal which repeats pixels 768 to 1286 and to the Y-scan D/A convertor 19 a digital signal which repeats lines 768 to 1286 and which increments when the output of the X-scan D/A convertor 18 reaches 1286.

As a result, the cathode ray tube 20 shows a part of the image information "A" magnified four times as shown in FIG. 6(b). When the magnification factor is further increased, a greater number of pixels may be required to hold the scan image. In such a case, degradation of the observed image may be avoided by employing an appropriate interpolation process an example of which uses the signal of each pixel a multiplicity of times, for example two times each in X and Y directions. Other interpolation arrangements are also possible. For example, rather than using the signal of each pixel a multiplicity of times, an average value of adjacent pixels in the image memory 14 may be obtained, which average value is then used to generate a part of the display between pixels. Other complicated, interpolation methods are also possible.

The read range set by the read address generating circuit 16 is not limited to the central area of the frame memory 14, but may be at any desired location and of any size. The speed of the read clock $CLK_2$ need not be the same as the write clock $CLK_1$. The write speed and the read speed may be set at different speeds, for example, giving 10 seconds for writing and one thirtieth of a second for reading.

With this embodiment, since the electron beam is prevented from scanning overlapping areas even at high magnification, it is possible to suppress increases in current density, temperature rise in the sample, accumulation of charges on insulating material of the sample, and contamination.

Thus, in the embodiments described above, a part of the content of the image memory 14 is selected, and displayed, to give an effective increase in magnification above the limit set by overlapping of the areas scanned by the beam for adjacent scanning lines. It is therefore possible to select two parts of the content of the image memory 14, so as to generate two different displays which may then be displayed simultaneously. The two displays may be of separate parts of the content of the image memory 14, thereby corresponding to different parts of the image, or the areas may overlap. Indeed, if the signals which form one display are of a larger part of the content of the image memory 14 then the other display, then the two will have different effective magnifications. It is thus possible simultaneously to display a display corresponding to the whole of one frame, at one magnification, and to display a part thereof at a higher magnification. This technique could be applied to magnifications below which results in scanning of overlapping areas.

FIG. 6 shows another embodiment of the present invention. As has previously been mentioned, the present invention seeks to prevent overlapping of the areas swept out by the scanning of adjacent scanning lines. This may also be achieved by cutting off (blanking) the beam for some of the lines of a scanning frame, enabling the remaining lines to be brought closer together. Blanking in this way does not achieve the same effect as a reduction in scan interval, because reduction in scan interval does not change the duration or time interval between one scan and the next. When one or more lines is blanked out, there is then a change in the time interval or duration between one scanning line and the next.

In the embodiment of FIG. 6, which is a functional block diagram, blocks having the same or similar function as the blocks of FIG. 1 are indicated by the same reference numerals. However, in the embodiment of FIG. 6, the read range setting means 55 is omitted, and a blanking interval setting means 59 is connected between the magnification factor input means 56 and the scan means 57. The blanking interval setting means 59 controls the blanking interval (duration) in dependence on the magnification, at least for magnifications above a predetermined limit. That predetermined limit will normally correspond to the case where adjacent scanning lines would otherwise sweep out overlapping areas.

Figure 7:
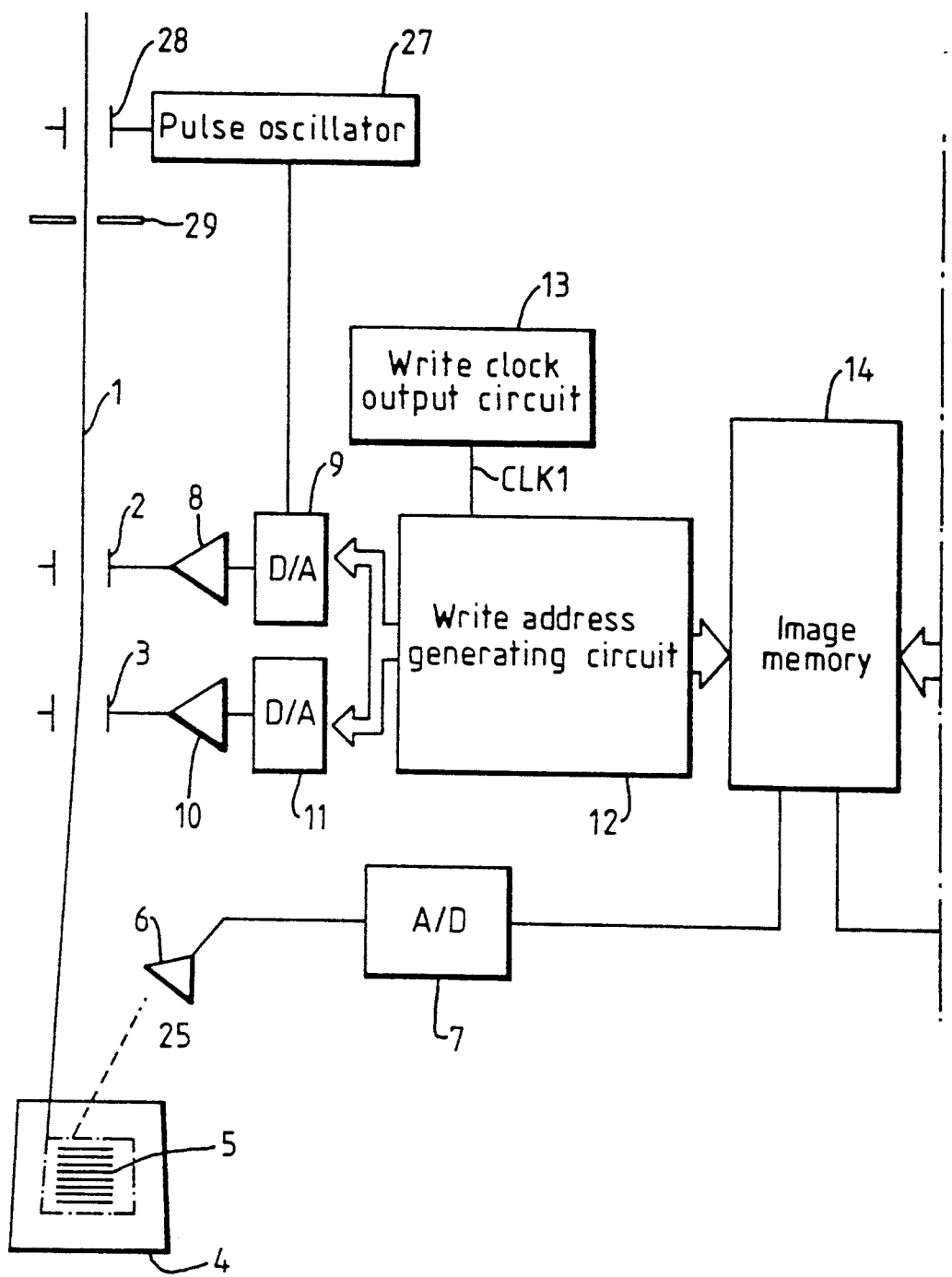
FIG. 7 is a schematic diagram of a scanning electron microscope incorporating the third embodiment of the present invention.

FIG. 7 then illustrates the embodiment of FIG. 6 in more detail. The arrangement of FIG. 7 is generally similar to that of FIG. 4, and corresponding parts are indicated by the same reference numerals.

In FIG. 7, a blanking deflection plate 28 is connected to a pulse oscillator 27. The pulse oscillator 27 detects a saw-tooth analog signal output from the D/A convertor 9 and produces a pulse signal that lasts one scan period at a predetermined cycle, for example every two or three scan timings, according to the magnification factor.

Thus, when the magnification factor becomes large enough to cause scanning of overlapping areas by the electron beam, the pulse oscillator 27 produces a pulse signal every alternate scan line. When the pulse signal is applied to the blanking deflection plate 28, the electron beam 1 is deflected, so that it is blocked by a blanking aperture 29 and does not strike the sample 4. As a result, scanning does not occur every alternate scan line, preventing overlapping of the areas swept out in the electron beam.

With this embodiment, a rise in current density even during high-magnification observation can be prevented or reduced and this helps control the temperature rise of the sample, accumulation of charges in insulating material of the sample, and contamination.

As mentioned above, the present invention seeks to control accumulation of charges on insulating material portions of a sample, and the present invention can address this problem even at magnifications less than that which causes overlapping areas to be swept out by adjacent scanning lines. Thus, for example, the embodiment of FIGS. 6 and 7 may be modified by controlling the blanking interval setting means to blank-out the beam for some of the frames, or to increase the interval between the frames. This will then reduce the time for which the beam is incident on the sample, thereby reducing build-up of charge. A further alternative is periodically to blank-off the beam within one or more scanning lines, again reducing the time for which the beam is incident on the sample.

In the arrangement shown in FIG. 7, blanking is achieved by deflecting the electron beam 1 so that it is blocked by the blanking aperture 29. This can be considered as cutting the beam to the sample, but it is also possible wholly to cut the beam by controlling the beam source (not shown in FIG. 7) so that the beam is not emitted by the source for the blanking interval However, it is normally more difficult to cut off the beam in this way than to cut it off by use of the blanking aperture 19.

Furthermore, the idea of blanking of the beam to increase the frame interval, or blanking within the scanning lines, may be applied at magnifications above those which cause the areas swept out by adjacent scanning lines to overlap. Although such overlapping is not desirable, the use of blanking reduces the total energy flux which the sample receives, so as to reduce increases in current density.

It should also be noted that the blanking of the beam described with reference to FIGS. 6 and 7 may be used in a scanning microscope which also embodies the control of the read range described with reference to the embodiments of FIGS. 1 to 4.

While the above embodiments have been shown to be applied to observation of a magnified image, the invention is also effective for focusing and astigmatism correction.

With the present invention, magnification may be increased by narrowing the read range in the frame memory. Hence, the focusing or astigmatic correction can be made by reading the sample image signal into the frame memory while changing the exciting current of the object lens, reading the sample image signal from a desired range of the memory, processing the data string by appropriate means, such as differentiation or Fourier conversion, and determining the object lens current when the high-frequency component is maximum.

In the above embodiments, the read range has been described as set at only one memory location, it is possible to set two or more read ranges of different sizes simultaneously (they may partially overlap each other) so that two or more scan images of different magnifications can be displayed simultaneously on the same screen or on a plurality of screens.

Thus, the present invention may provide the following advantages.

(1) By narrowing the read range in the frame memory for the sample image signal, there is an effective increase in the magnification factor. This permits generation of a scan image magnified to a desired factor, without having to reduce the scan intervals to an extent that will cause overlapped areas to be swept by the energy beam. This in turn reduces or eliminates increases in the current density on the sample surface and therefore prevents or reduces temperature rise of the sample, accumulation of charge in insulating material of the sample, and contamination.

(2) During high-magnification observation, during which the energy beam may sweep out areas which overlap, the beam is intermittently blanked out to limit increases in the current density, so that a temperature rise of the sample, accumulation of charges on insulating material of the sample and sample contamination during high-magnification observation can be prevented.

What is claimed is:

1. A scanning microscope comprising:
   scan means for causing an energy beam to scan a sample;
   detection means for detecting the interaction of said beam with said sample and for generating sample image signals;
   an image memory for storing said sample image signals;
   means for setting a magnification for said scanning microscope;
   means for reading the sample image signals of a selected part of said image memory, the proportion of said image memory corresponding to said selected part being determined in dependence on said magnification; and
   display means for generating and displaying an image from said sample image signals of said selected part of said image memory.

2. An apparatus according to claim 1, wherein said scan means includes means for causing said energy beam to scan said sample in a series of adjacent scanning lines having scan intervals therebetween, and the apparatus further includes means for varying the scan intervals between said scanning lines.

3. A scanning microscope comprising:
   scan means for causing an energy beam to scan a sample;
   detection means for detecting the interaction of said beam with said sample and for generating sample image signals;
   an image memory for storing said sample image signals;
   means for reading the sample image signals of a selected part of said image memory and the sample image signals of a further part of said image memory; and
   display means for displaying simultaneously a first image generated from the sample image signals of said selected part of said image memory, and a second image generated from the sample image signals of said further part of said image memory.

4. An apparatus according to claim 3, wherein, said further part of said image memory includes at least a part of said selected part of said image memory.

5. A scanning microscope, comprising:
   means for setting a magnification for said scanning microscope;
   scan means for causing an energy beam to scan a sample;
   beam cutting means for intermittently and repeatedly cutting off said beam from said sample during said scanning at a cutting interval;

means for varying said cutting interval in dependence on said magnification;

detection means for detecting the interaction of said beam with said sample and for generating sample image signals; and display means for generating and displaying an image from at least some of said sample image signals.

6. A scanning microscope, comprising:

means for setting a magnification for said scanning microscope;

scan means for causing an energy beam to scan a sample;

beam cutting means for intermittently and repeatedly cutting off said beam from said sample during said scanning at a cutting duration;

means for varying said cutting duration in dependence on said magnification;

detection means for detecting the interaction of said beam with said sample and for generating sample image signals; and display means for generating and displaying an image from at least some of said sample image signals.

7. A scanning microscope comprising:

means for setting a magnification for said scanning microscope;

scan means for causing an energy beam to scan a sample;

beam control means for causing said beam to alternate between on and off states on said sample during said scanning such as to define a blanking ratio between the durations of said on and off states;

means for varying said blanking ratio in dependence on said magnification;

detection means for detecting the interaction of said beam with said sample and for generating sample image signals; and display means for generating and displaying an image from at least some of said sample image signals.

8. A method of operating a scanning microscope in which a sample is scanned by an energy beam to generate sample image signals, said sample image signals are stored in an image memory, and the sample image signals of a selected part of said image memory are read to generate a display image;

wherein the magnification of the scanning microscope is varied, and the proportion of said image memory corresponding to said selected part is varied in dependence on the variation in magnification.

9. A method according to claim 8, wherein, for magnifications less than a predetermined magnification value, the proportion of said image memory corresponding to said selected part is fixed.

10. A method according to claim 9, wherein said sample is scanned over a scan area which is fixed for magnifications greater than said predetermined magnification value.

11. A method according to claim 9, wherein said sample is scanned in a series of adjacent scanning lines by a spot of said energy beam, and said predetermined magnification corresponds to the magnification at which the area of said sample scanned by said spot for one scanning line is contiguous with the area scanned by said spot for an adjacent scanning line.

12. A method according to claim 8, further including reading the scanning image signals of a further part of said image memory to generate a further display image, and displaying simultaneously said display image and said further display image.

13. A method according to claim 12 wherein said further part of said image memory includes at least a part of said selected part of said image memory.

14. A method according to claim 8, wherein said display image is displayed on a display unit, and for magnifications above a predetermined limit, interpolation signals are added to said display image, said interpolation signals being derived from the sample image signals of said selected part of said image memory.

15. A method of operating a scanning microscope in which a sample is scanned by an energy beam to generate sample image signals, said sample image signals are stored in an image memory, and the sample image signals of a selected part of said image memory are read to generate a display image;

wherein the method also includes reading the sample image of a further part of said image memory to generate a further display image, and displaying simultaneously said display image and said further display image.

16. A method according to claim 15 wherein said further part of said image memory includes at least a part of said selected part of said image memory.

17. A method of operating a scanning microscope in which a sample is scanned by an energy beam to generate a display image, said energy beam being intermittently and repeatedly cut off from said sample at a cutting interval during said scanning;

wherein the magnification of the scanning microscope is varied, and the cutting interval is varied in dependence on the variation in magnification.

18. A method according to claim 17, wherein said scanning comprises a plurality of scanning frames and said beam is cut between said scanning frames, thereby to cause said intermittent cutting.

19. A method according to claim 17, wherein said scanning comprises a plurality of scanning frames and each scanning frame comprises a plurality of scanning lines, said beam being cut between said scanning lines, thereby to cause said intermittent cutting.

20. A method according to claim 17, wherein said scanning comprises a plurality of scanning frames and each scanning frame comprises a plurality of scanning lines, said beam being cut within at least some of said scanning lines, thereby to cause said intermittent cutting.

21. A method according to claim 17, wherein, for magnification less than a predetermined magnification value, said cutting interval is fixed.

22. A method according to claim 17, wherein, for magnifications less than a predetermined magnification value, said cutting interval is zero.

23. A method according to claim 21, wherein said sample is scanned in a series of adjacent scanning lines by a spot of said energy beam, and said predetermined magnification corresponds to the magnification at which the area of said sample scanned by said spot for one scanning line is contiguous with the area scanned by said spot for an adjacent scanning line.

24. A method of operating a scanning microscope in which a sample is scanned by an energy beam to generate a display image, said energy beam being intermittently and repeatedly cut off from said sample at a cutting duration during said scanning;

wherein the magnification of the scanning microscope is varied, and the cutting duration is varied in dependence on the variation in magnification.

25. A method of operating a scanning microscope in which a sample is scanned by an energy beam to generate a display image; said energy beam alternating between on and off states on the sample during said scanning such as to define a blanking ratio between the durations of said on and off states;

wherein the magnification of the scanning microscope is varied and the blanking ratio is varied in dependence on the variation in magnification.

26. A method of operating a scanning microscope in which a sample is scanned by an energy beam to generate a display image, said scanning comprising a plurality of sequential scanning frames with a frame interval therebetween;

wherein said frame interval is varied for magnifications of said scanning microscope above a predetermined magnification.

27. A method of operating a scanning microscope in which a sample is scanned by an energy beam to generate a display image, said scanning comprising a plurality of sequential scanning frames, each frame having a plurality of scanning lines with a line interval duration therebetween;

wherein said line interval duration is varied for magnifications of said scanning microscope above a predetermined magnification.

28. A method of operating a scanning microscope in which a sample is scanned by an energy beam to generate a display image, said scanning comprising a plurality of sequential scanning frames, each frame having a plurality of scanning lines;

wherein at least some of said scanning lines are discontinuous for magnifications of said scanning microscope above a predetermined magnification.

* * * * *